(12) United States Patent
Patterson

(10) Patent No.: US 8,106,653 B2
(45) Date of Patent: Jan. 31, 2012

(54) OPTICAL-MAGNETIC KERR EFFECT WAVEFORM TESTING

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 398 days.

(21) Appl. No.: 12/466,239

(22) Filed: May 14, 2009

(65) Prior Publication Data

US 2010/0289488 A1    Nov. 18, 2010

(51) Int. Cl.
*G01R 33/02* (2006.01)
(52) U.S. Cl. .................................... 324/244.1
(58) Field of Classification Search .......... None
See application file for complete search history.

(56) References Cited

U.S. PATENT DOCUMENTS

| | | | |
|---|---|---|---|
| 4,837,506 A | | 6/1989 | Patterson |
| 5,432,461 A | * | 7/1995 | Henley ................ 324/760.02 |
| 7,733,100 B2 | * | 6/2010 | Kasapi ................ 324/754.22 |

\* cited by examiner

*Primary Examiner* — Paresh Patel
(74) *Attorney, Agent, or Firm* — Law Office of Gerald Maliszewski; Gerald Maliszewski

(57) ABSTRACT

System and methods are provided for optical-magnetic Kerr effect signal analysis. In one aspect, a test fixture is supplied having parallel conductive lines, with an input of a first line adjacent a resistively loaded output of a second line and a resistively loaded output of the first line adjacent an input of the second line. An optically transparent test region is interposed between the conductive lines, and a metallic reflector underlies the test region. A signal reference is supplied to the input of the first line and a signal under test is supplied to the input of the second line. A light beam having a first angle of polarization is focused through the test region onto the reflector. The intensity of the reflected light is measured and the similarity between the signal under test and the reference signal can be determined in response to the measured light intensity.

6 Claims, 12 Drawing Sheets

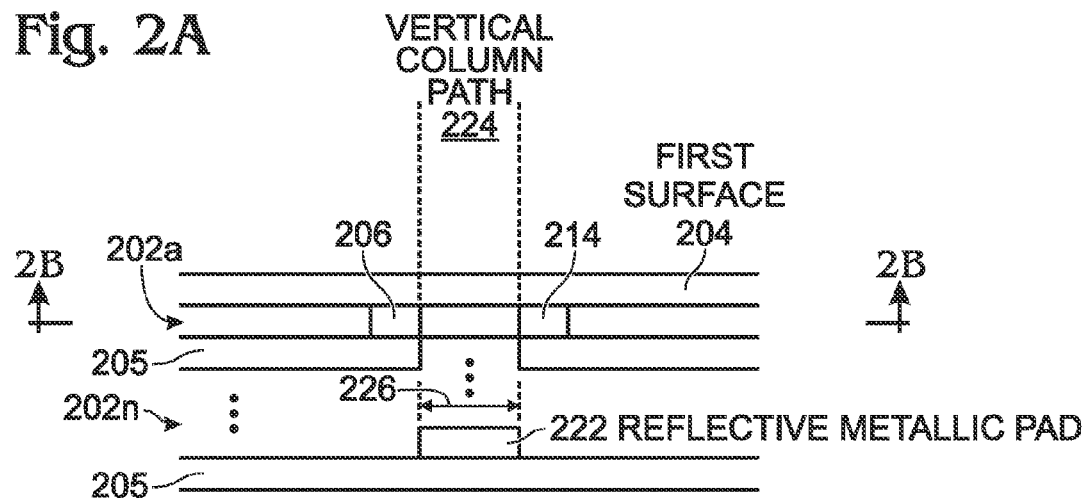
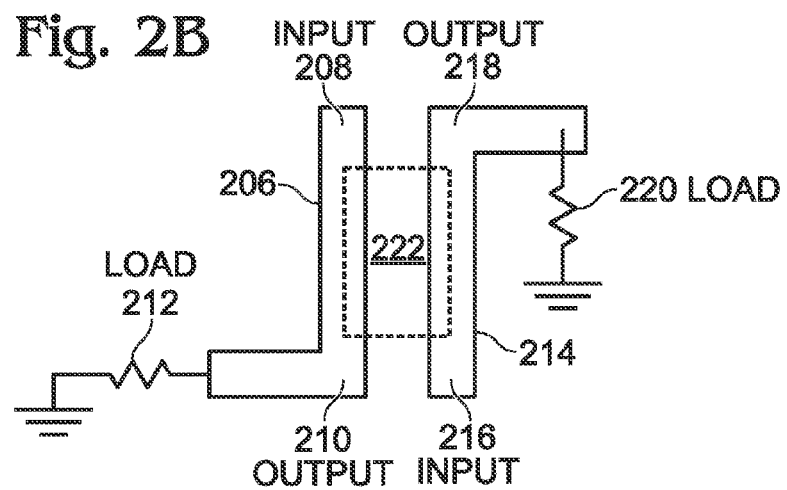

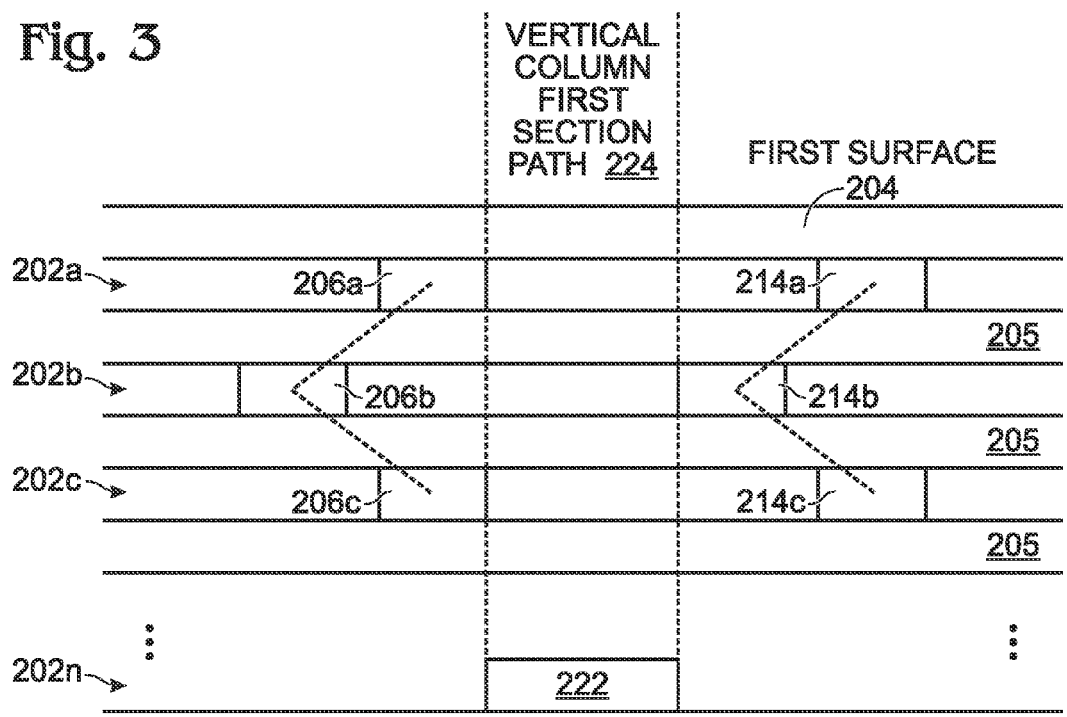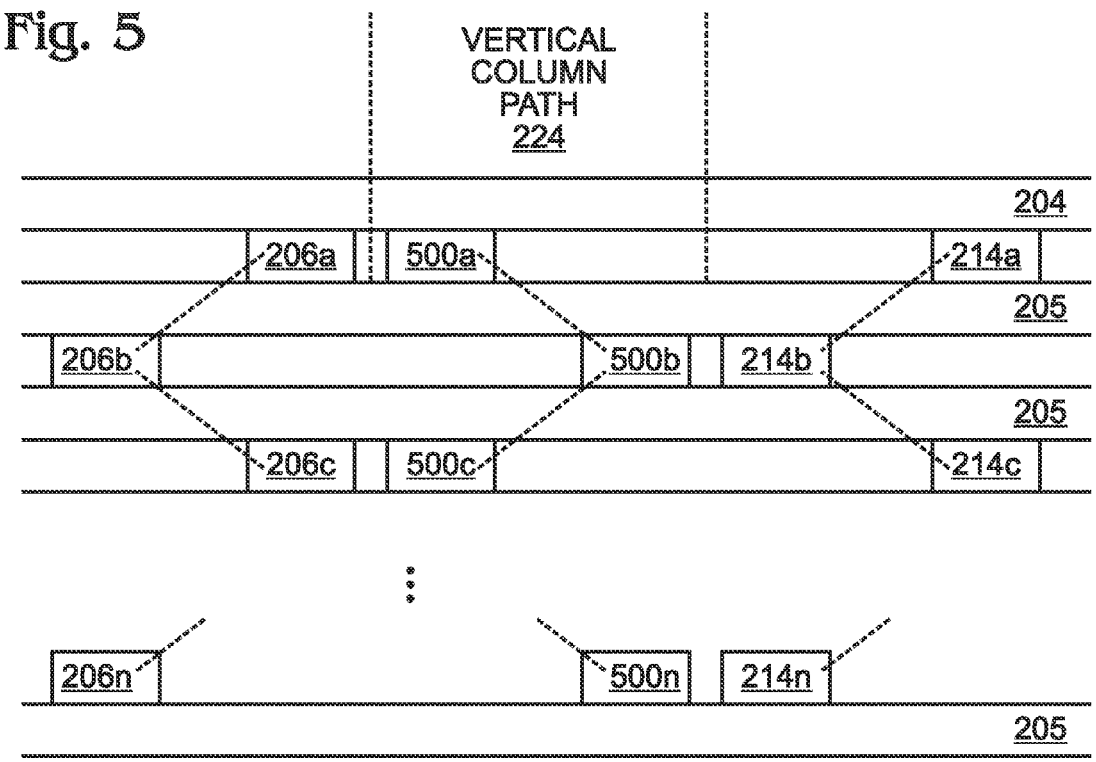

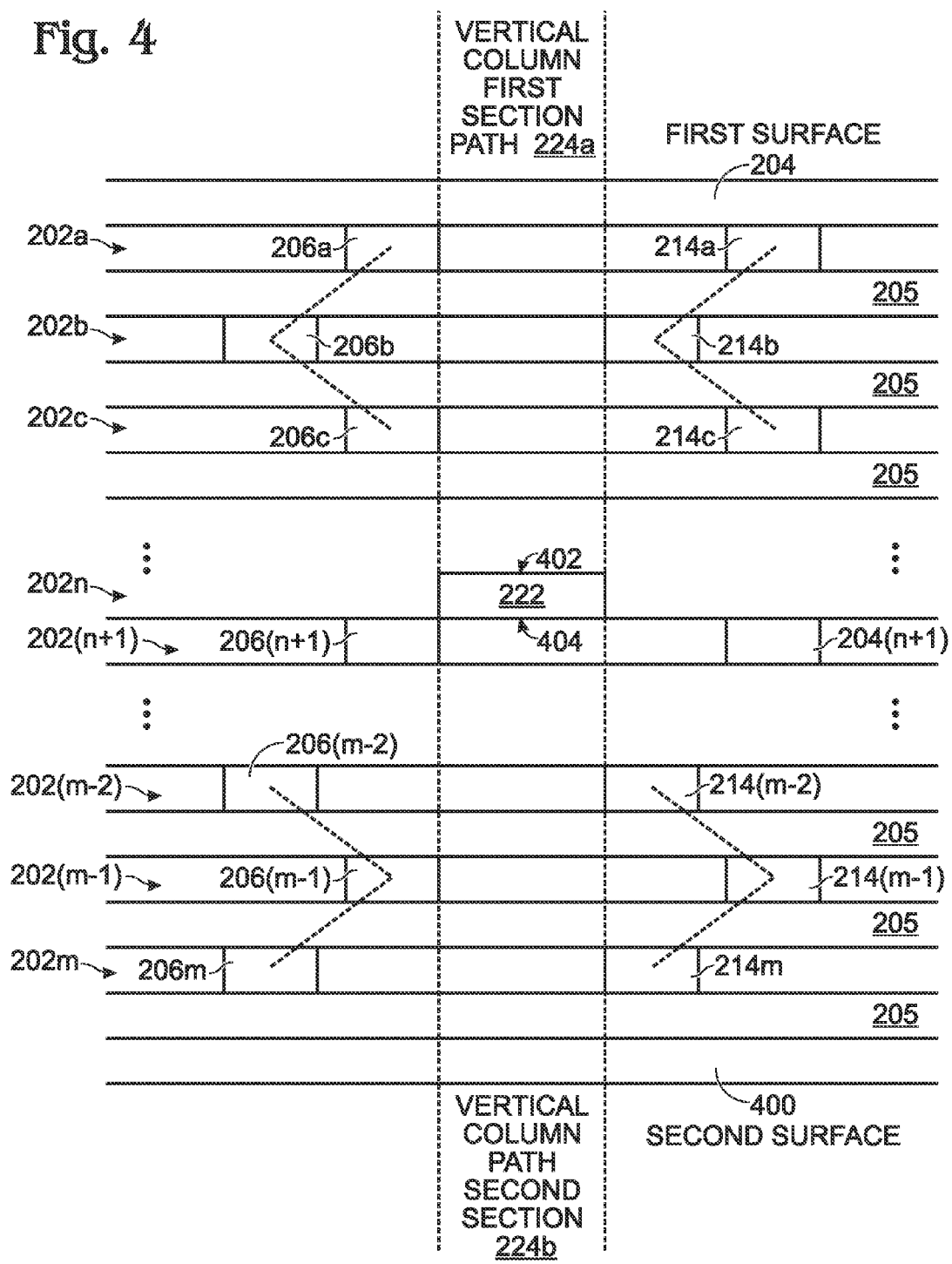

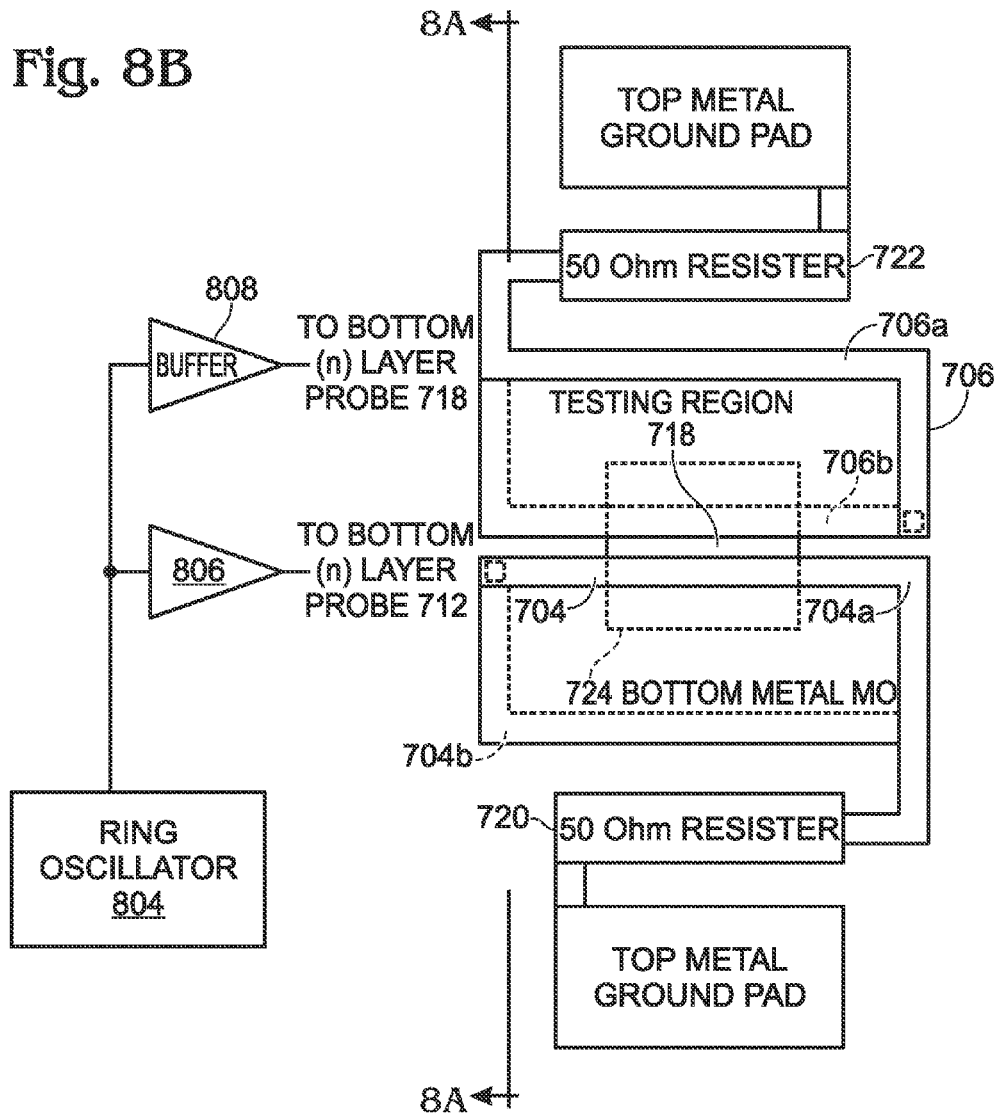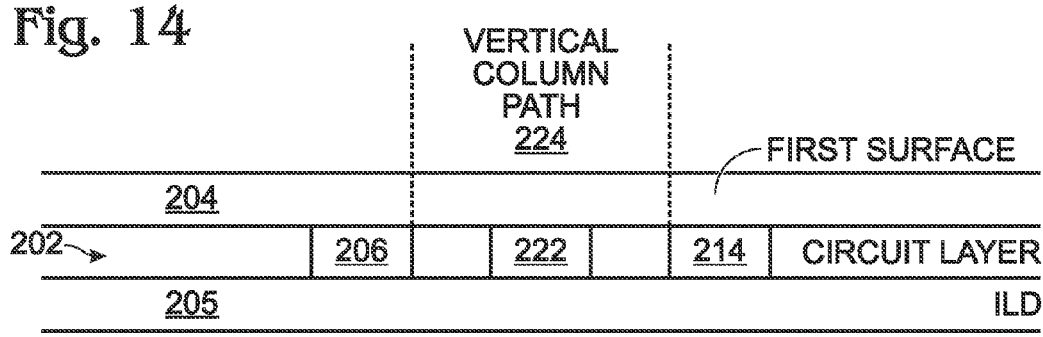

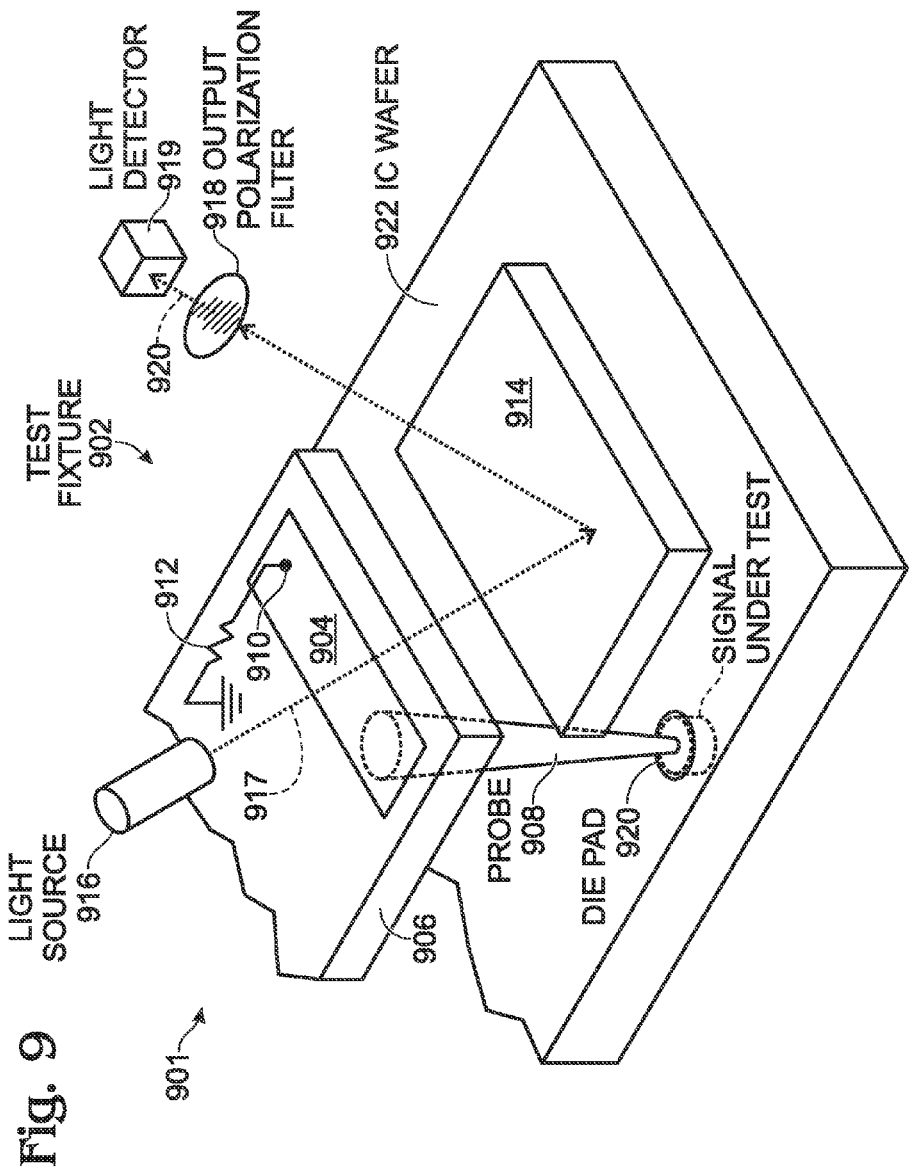

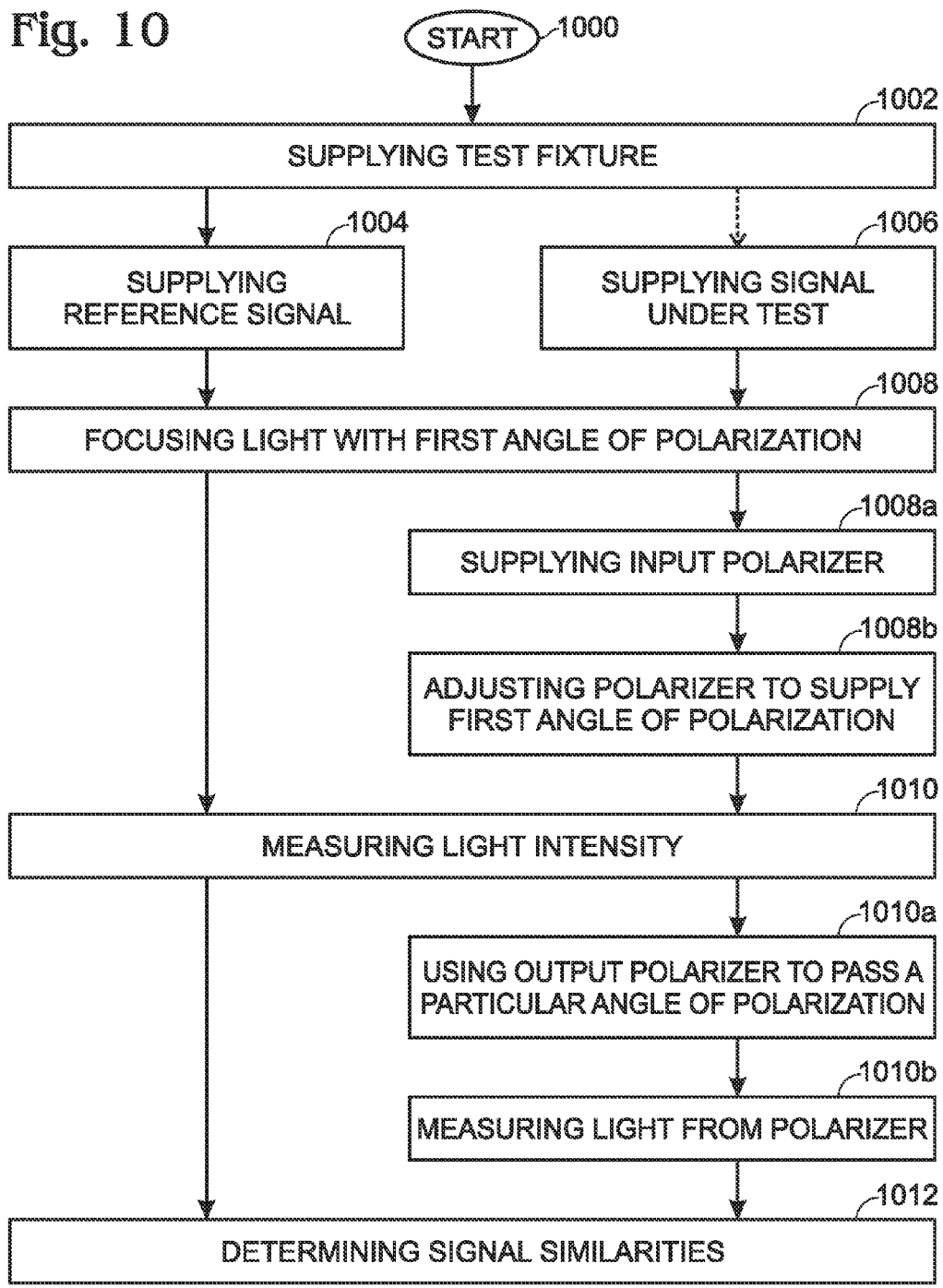

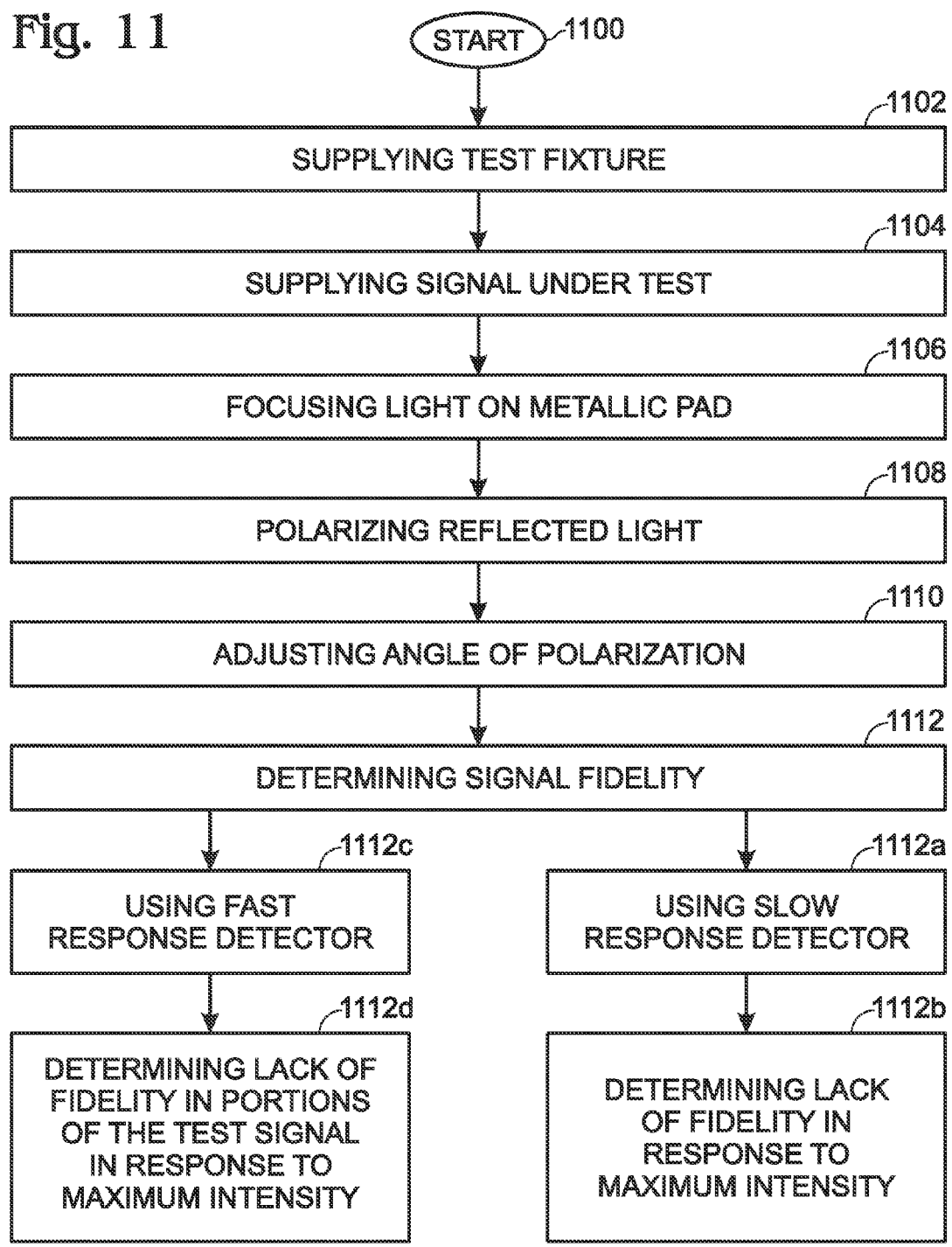

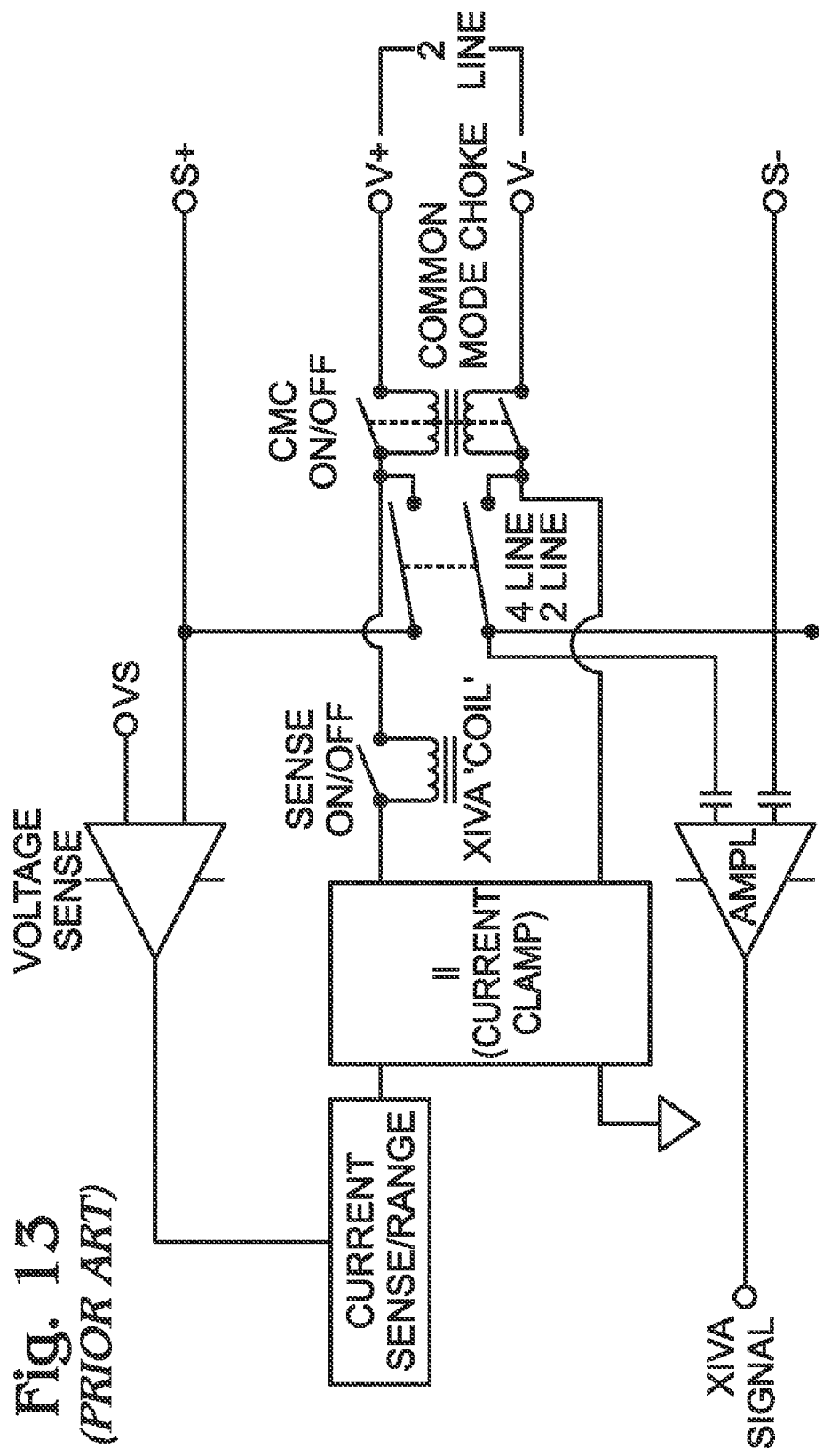
Fig. 13 *(PRIOR ART)*

OPTICAL-MAGNETIC KERR EFFECT WAVEFORM TESTING

BACKGROUND OF THE INVENTION

1. Field of the Invention

This invention generally relates to electrical signal testing and, more particularly, to method and tools for using the Kerr effect to test electrical signals.

2. Description of the Related Art

IC devices are formed from a die of active semiconductor devices. The die can be mounted in a hybrid circuit, printed circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages. While the package provides protection, it makes access to the die difficult.

FIGS. 1A and 1B are perspective views of a dual in-line package (DIP) and an IC die without a package, respectively (prior art). It is common for a package body or lead frame 100 to have a die attach area 102. The die 106 has electrical contact pads on its top surface. Inner leads 108 connect pads on die top surface to outer leads or lead frames 110. Once the inner leads are bonded to the lead frames, the package is sealed with ceramic, in a metal can, or in a polyimide. Epoxy resins are also a common choice. Glass beads are commonly mixed in with the epoxy to reduce strain in the epoxy film during changes in temperature.

Optical beam induced current (OBIC) is a semiconductor analysis technique performed using laser signal injection. The technique induces current flow in the semiconductor sample through the use of a laser light source. By monitoring current flow or voltage changes on the leads, and cross-referencing to the position of the laser, it is possible estimate the particular devices being effected. This technique is used in semiconductor failure analysis to locate buried diffusion regions, damaged junctions, and gate oxide shorts.

FIG. 12 depicts an exemplary system for inducing current flow by creating optical paths through an IC package (prior art). Typically, the analysis is performed after the package overlying the die has been removed. Selected power pins from the IC are connected to a sense amp 900, as are the IC grounds. A laser 902 scans an area of an IC die 904. The scanning area is defined by an x-y coordinate system. The IC die 904 is mounted on a movable table 906. Alternately, the IC die position is fixed and the laser moves. The scan pattern need not necessarily follow the x-y grid. In some aspects, only selected areas of the surface over the die are scanned.

FIG. 13 is a detailed schematic of a sense amplifier (prior art). The sense amplifier connects lines V+ and S+ to IC power supply lines, while inputs V− and S− are typically connected to ground. In other aspects, the sense amplifier lines may be connected to signal inputs or signal outputs.

Electrical connections are made to the power supply pins of the device and these connections go to a current amplifier for video imaging the package or die surface as the OBIC laser is scanned. The OBIC laser has a 1065 nanometers wavelength and does not ablate the epoxy mold compound. This wavelength will generate electron hole pairs in the semiconductor die and create a current if the laser light reaches the die surface (and the junctions are not covered by metal).

The OBIC technique may be used to detect the point at which a focused ion beam (FIB) milling operation in bulk silicon of an IC must be terminated. This is accomplished by using a laser to induce a photocurrent in the silicon, while simultaneously monitoring the magnitude of the photocurrent by connecting an ammeter to the device's power and ground. As the bulk silicon is thinned, the photocurrent increases as the depletion region of the well to substrate junction is reached. FIB milling operations are terminated in a region below the well depth, so the device remains operational.

IC dies are fabricated from multiple layers of metal, silicon active devices, interconnections, and dielectric insulation. Typically, one or more metal layer is located near the top of the die for the purpose of distributing power and to act as ground. Since lasers cannot image through these metal layers, laser imaging for fault location is commonly performed from the back of the die to produce an image in the X-Y plane using a technique that is commonly called TIVA (thermally induced voltage alteration). Defects are often more thermally sensitive than non defect sites.

From the perspective of testing and quality control, it would be ideal if every important signal in an IC had an outside interface pin or pad. There are only a limited number of signals that can brought out, so OBIC and TIVA techniques must be used to investigate suspected signal failures and deduce probable failures. However, OBIC and TIVA techniques can be time consuming to implement, and on a practical level, they cannot efficiently detect every internal signal in an IC.

It would be advantageous if internal IC test ports existed that permitted a more direct measurement of signals, without the use of external interface pins.

SUMMARY OF THE INVENTION

Disclosed herein are a test fixture and IC design to address the above-mentioned signal access problems. Generally, the method uses the optical-magnetic Kerr effect properties of an optical beam to measure the parameters of an associated electrical signal. An electromagnetic field is created in a reflective metallic surface in close proximity to a conductive line carrying the signal under test. A light beam reflected off the metallic surface is polarized in response to the electromagnetic field, and the angle of polarization can be measured. The measured polarization permits conclusions to be made regarding the signal under test. In one aspect, the electrical signal can be tested in fixture. In another aspect, an IC can be fabricated to permit Kerr effect measurements.

Accordingly, a method is provided for optical-magnetic Kerr effect signal analysis. A test fixture is supplied having parallel conductive lines, with an input of a first line adjacent a resistively loaded output of a second line and a resistively loaded output of the first line adjacent an input of the second line. An optically transparent test region is interposed between the conductive lines, and a metallic reflector underlies the test region. A signal reference is supplied to the input of the first line and a signal under test is supplied to the input of the second line. A light beam having a first angle of polarization is focused through the test region onto the reflector. The intensity of the reflected light is measured and the similarity between the signal under test and the reference signal can be determined in response to the measured light intensity at various angles of polarization at which the reflected light may be displaced.

If the light detector has a frequency response slower that the reference frequency, a maximum light intensity can be measured, which indicates that the reference signal and signal under test are different. If the test signal is correct and matches the reference signal, then the change in light polarization is self-canceling. If the light detector has a frequency response greater than the first frequency, then maximum light intensities can be associated with particular information patterns in the reference signal.

Additional details of the above-described method, test fixtures, and an integrated circuit (IC) with an optical-magnetic Kerr effect test port, are provided below.

BRIEF DESCRIPTION OF THE DRAWINGS

FIGS. 2A and 2B are partial cross-sectional and plan views, respectively, of an integrated circuit (IC) with an optical-magnetic Kerr effect test port.

FIG. 3 is a partial cross-sectional view of a first variation of the optical-magnetic Kerr effect IC test port.

FIG. 4 is a partial cross-sectional view of a second variation of the optical-magnetic Kerr effect IC test port.

FIG. 5 is a partial cross-sectional view of a third variation of the optical-magnetic Kerr effect IC test port.

FIGS. 8A and 8B are respective partial cross-sectional and plan views of a variation of the optical-magnetic Kerr effect signal analysis system of FIG. 7.

FIG. 9 is a schematic block diagram of an alternative type of optical-magnetic Kerr effect signal analysis system.

FIG. 10 is a flowchart illustrating a method for optical-magnetic Kerr effect signal analysis.

FIG. 11 is a flowchart illustrating a variation in the method for optical-magnetic Kerr effect signal analysis.

FIG. 13 is a detailed schematic of a sense amplifier (prior art).

FIG. 14 is fifth variation of the IC with the optical-magnetic Kerr effect test port.

DETAILED DESCRIPTION

Figure 1A:
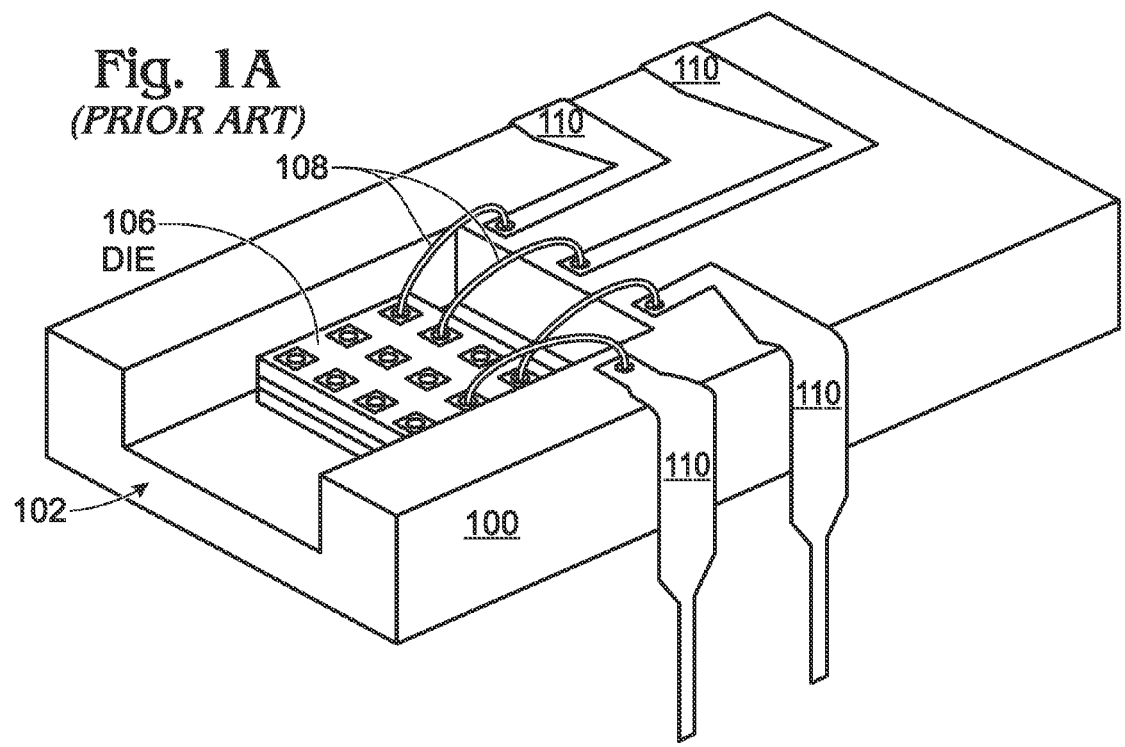
FIGS. 1A and 1B are perspective views of a dual in-line package (DIP) and an IC die without a package, respectively (prior art).
Figure 1B:
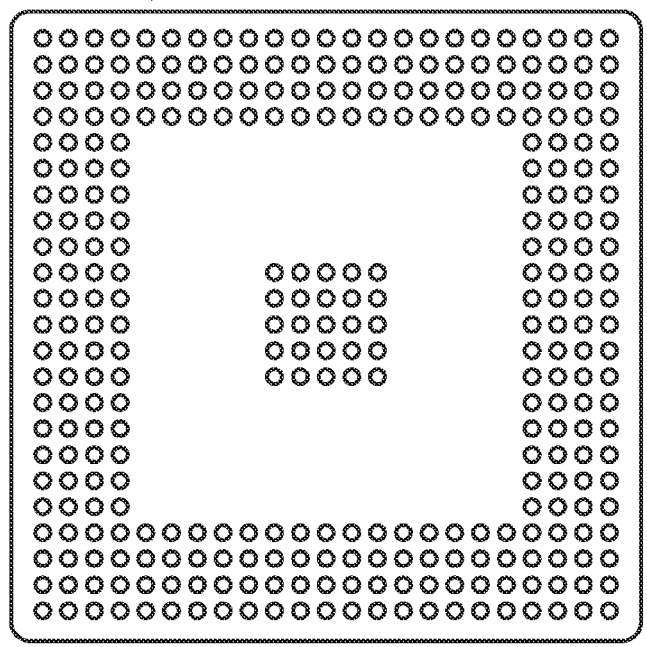

Light is an electromagnetic wave produced by vibrating electric charges. Alternately stated, an electromagnetic wave is a transverse wave which has both an electric and a magnetic component. The transverse nature of electromagnetic waves means that the electric and magnetic vibrations occur in numerous planes. A light wave that is vibration in more than one plane is referred to as unpolarized light. Light emitted by the sun, by a conventional lamp, or by a candle frame is unpolarized. Such light waves are created by electric charges that vibrate in a variety of directions, thus creating an electromagnetic wave that vibrates in a variety of directions.

It is possible to transform unpolarized light into polarized light. Polarized light waves are light waves in which the vibrations occur in a single plane. There are a variety of methods of polarizing light including: polarization by transmission; reflection, refraction, and scattering.

One common method of polarization involves the use of a Polaroid filter. Polaroid filters are made of a special material which is capable of blocking planes of vibration of an electromagnetic wave. When unpolarized light is transmitted through a Polaroid filter, it emerges as polarized light with one-half the intensity and with vibrations in a single plane.

Polarized light also changes its direction (rotation) of the polarization when reflected off a surface with a magnetic field emanating perpendicular to the reflective surface. The polished surface of one pole of an electromagnet is one such surface. The surface of a metal immersed in a magnetic field is another such surface. To utilize the Kerr effect to monitor electronic signals on conductors, a polarized light source, such as laser beam, is directed at a reflective metal line (test point pad) adjacent to and just below the metal line carrying the electrical signal to be monitored. The switching (ac) signal in the line to be monitored produces a magnetic field around it that reverses when the direction of current in the line reverses, or decreases to zero if the electrical current decreases to zero. The polarized light beam passes through this alternating magnetic field as it passes next to the signal line and reflects off the test point pad metal surface. The reflected light beam has a polarization angle that is passed through an optical analyzer and light detector that determine a change in polarization angle resulting from the Kerr effect. This switching polarization pattern is compared to a known correct switching pattern to determine if the electrical signal is correct. This method will work up to the response time of the optical detector, which at the time of this writing is about 28 gigabit per second (Gbs).

To utilize the Kerr effect for signals switching at speeds higher than the optical detector response time, the signals of two complementary signal lines, the signal under test and a reference signal, are arranged so that they are both adjacent to the reflective test point pad. Because they are complementary signals, the respective currents are always in the same or always opposite direction (according to the physical layout). Therefore, the magnetic field around them will be always additive or subtractive if the signals are the same. The light beam is passed at an equal distance between the two signal lines and the angle of polarization induced in the light is the summation of both fields. If the fields are in opposite direction and equal in magnitude, the fields cancel and no net rotation results in the reflected light beam. Assuming that the physical layout is such that the fields are always canceling for a correct test signal, then the optical analyzer and light detector senses no change. If the test signal is incorrect, a change in polarization angle occurs that is sensed by the light detector. Even though the light detector cannot respond as fast as the frequency of the electrical signals, and the detection pulses are delayed and longer in duration than the electrical signal pulses, the detection of a change in polarization (light intensity) can be used to deduce an incorrect electrical signal.

FIGS. 2A and 2B are partial cross-sectional and plan views, respectively, of an integrated circuit (IC) with an optical-magnetic Kerr effect test port. The IC 200 comprises a first circuit layer 202a underlying a first surface 204 of an IC. The first surface 204 can be either a top or bottom surface. An nth circuit layer 202n underlies the first circuit layer 202a, where n is a variable not limited to any particular value. The nth circuit layer need not necessarily directly underlie the first circuit layer. As shown, no other circuit layer are interposed between the first circuit layer 202a and the surface 204. However, in other aspect not shown in this figure, other circuit layers may intervene between the first circuit layer and the first surface. Passivation layers 205 are interposed between the circuit layers 202. A first conductive line 206 is formed on the first circuit layer 202 having an input 208 connected to receive a first signal under test and an output 210 connected to a resistive load 212.

A second conductive line 214 on the first circuit layer 202a is parallel the first line 206 and has an input 216 adjacent the first line output 210 and an output connected 218 to a resistive load 220 adjacent the first line input 208. An optically reflective metallic pad 222 is formed on the nth circuit layer 202*n*. A vertical column path 224 between the first line 206 and the second line 214 is optically transparent from the IC first surface 204 to the reflective metal pad 222. Typically, the parallel conductive lines 206/214 are separated by a distance 226 in the range between one and ten first wavelengths, at which the vertical column is transparent. Note: the vertical column path between conductive lines 206 and 208 may be formed from air/vacuum gaps or the use of dielectrics that are transparent at the frequency of interest.

The reflective metallic pad 222 may be cobalt, which has favorable magnetic properties for the Kerr effect. Nickel is also a favorable metal for the Kerr effect, and is practical for 65 nanometer technology.

FIG. 3 is a partial cross-sectional view of a first variation of the optical-magnetic Kerr effect IC test port. In this aspect the first conductive line 206 includes sections (206*a* through 206*n*) formed on n circuit layers 202, interconnected to adjacent circuit layers through vias represented schematically as dotted lines. Likewise, the second conductive line 214 includes sections (214*a*-214*n*), parallel to the first conductive line sections 206, formed on the n circuit layers 202, interconnected to adjacent circuit layers through vias represented schematically as dotted lines. More explicitly, the first conductive line sections on the odd numbered circuit layers are connected by vias (represented schematically as dotted lines) to first conductive line sections on the even numbered circuit layers that are offset away from the vertical column path 224, to form a helical coil. Likewise, the second conductive line sections on the even numbered circuit layers are connected by vias (represented schematically as dotted lines) to second conductive line sections on the odd numbered circuit layers that are offset from the vertical column path 224, to form a helical coil. In combination, the helical coil formed by the first conductive line sections is interleaved with the helical coil formed by the second conductor line sections.

As would be understood by a person will skill in the art, if the vias between layers are simply staggered on each layer at opposite ends, then current will flow in the lines, but the current flow in one layer will be in opposite direction from the overlying and underlying layers. A current flow in opposite directions, however, would create magnetic fields in opposite directions as a result of self-canceling mutual inductance. Without a magnetic field, the Kerr effect cannot be utilized. Therefore, the IC must be designed such that the direction of current in overlying traces is the same. In one aspect, this design can be accomplished by offsetting traces. For example, the current through trace 206*a* may be "into" the page. Trace 206*b*, connected to trace 206*a* through a via, would then conduct current "out" of the page, and trace 206*c* would conduct current into the page. Traces 206*a* and 206*c* overlie each other in the same vertical plane, but because the current flow through each is in the same direction, the magnetic fields created are reinforced rather than canceled. The magnetic field created by the current through 206*b* minimally impacts the magnetic field created by traces 206*a* and 206*c*, since it is in a different (offset) vertical plane. Other designs for creating reinforced magnetic fields using overlying circuit layers would be known by those with skill in the art.

FIG. 4 is a partial cross-sectional view of a second variation of the optical-magnetic Kerr effect IC test port. In this aspect, a second IC surface 400 is of interest. If the first surface 204 is the top surface, then the second surface 400 is the bottom surface, and visa versa. This aspect also includes additional circuit layers (n+1) through m, interposed between the nth circuit layer 202*n* and the second IC surface 400. The first conductive line 206 includes sections (206*a*-206(*m*−1)) formed on odd numbered circuit layers (202*a*, 202*c*, ... 202(*m*−1)), interconnected to communicating circuit layers through vias. The second conductive line 214 includes sections (214*b*-214*m*) formed on even numbered circuit layers, interconnected to communicating circuit layers (202*b*, 202*d*, 202*m*) through vias. As noted above, a variety of means are known by designers to interconnect different metal levels in an IC in a manner that would reinforce magnetic fields. More explicitly, the first conductive line sections on the odd numbered circuit layers are connected by vias (represented schematically as dotted lines) to first conductive line sections on the even numbered circuit layers that are offset away from the vertical column path 224, to form a helical coil. Likewise, the second conductive line sections on the even numbered circuit layers are connected by vias (represented schematically as dotted lines) to second conductive line sections on the odd numbered circuit layers that are offset from the vertical column path 224, to form a helical coil. In combination, the helical coil formed by the first conductive line sections is interleaved with the helical coil formed by the second conductor line sections.

The reflective metallic pad 222 is a two-sided metallic pad with both the top 402 and bottom surface 404 being reflective. A first section 224*a* of the optically transparent vertical column path is formed in the n circuit layers and a second section 224*b* is formed in the (n+1) to m circuit layers.

FIG. 5 is a partial cross-sectional view of a third variation of the optical-magnetic Kerr effect IC test port. As in FIGS. 3 and 4, the first conductive line 206 includes sections formed on n circuit layers 202, interconnected to adjacent circuit layers through vias (represented schematically as dotted lines). Likewise, the second conductive line 214 includes sections, parallel to the first conductive line sections, formed on the n circuit layers 202, interconnected to adjacent circuit layers through vias represented schematically by dotted lines.

In this aspect an inner core of conductive line sections 500 are formed in between each first and second conductive lines 206/214 on each of the n circuit layers 202, interconnected to adjacent circuit layers and the metallic reflective pad 222 through vias represented schematically as dotted lines. More explicitly, the conductive line sections on the odd numbered circuit layers (e.g., 500*a*) are connected by vias (represented schematically as dotted lines) to conductive line sections on the even numbered circuit layers (e.g., 500*b*) that are offset to form a helical coil. In combination, the helical coil formed by the first conductive line sections is interleaved with the helical coils formed by the second conductor line sections and conductive sections 500.

Figure 6:
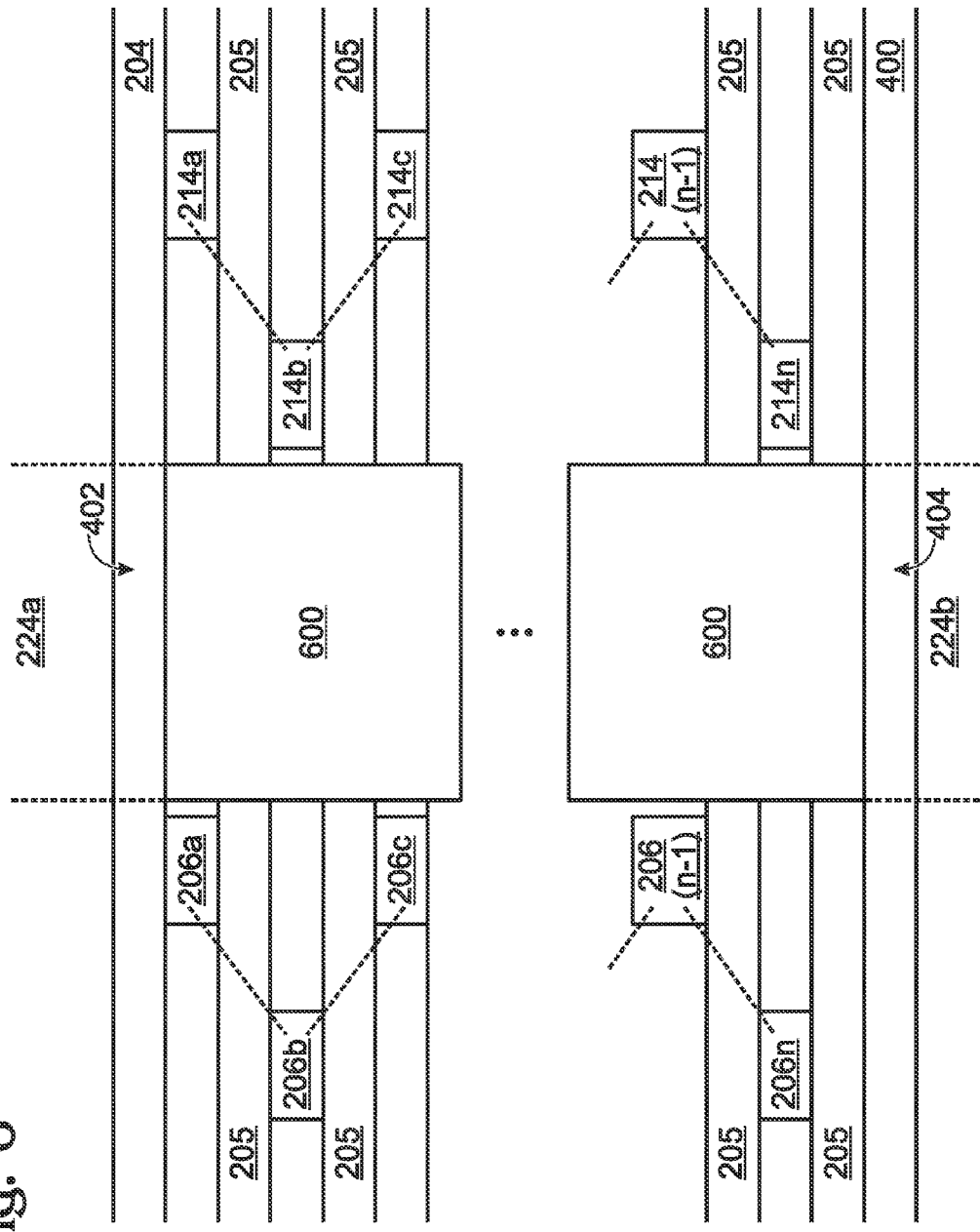
FIG. 6 is a partial cross-sectional view of a fourth variation of the optical-magnetic Kerr effect IC test port.

FIG. 6 is a partial cross-sectional view of a fourth variation of the optical-magnetic Kerr effect IC test port. As in FIGS. 3, 4, and 5, the first conductive line 206 includes sections formed on n circuit layers 202, interconnected to adjacent circuit layers through vias schematically represented as dotted lines to form a helical coil. Likewise, the second conductive line 214 includes sections, parallel to the first conductive line sections, formed on the n circuit layers 202, interconnected to adjacent circuit layers through vias schematically represented as dotted lines to form a helical coil.

In this aspect, the metallic reflective pad is a solid metallic core 600 formed in between each first and second conductive lines 206/214 on each of the n circuit layers 202. The metallic core 600 may be copper, with the ends capped with the nickel or cobalt on the bottom and nickel at the top. Metallic reflectors 402/404 are formed on the ends of this core 600, so that light can be focused on either the top or through the back of the die/wafer.

FIG. 14 is fifth variation of the IC with the optical-magnetic Kerr effect test port. As in the other variations, a circuit layer 202 underlies a first surface 204 of an IC. A first conductive line 206 is formed on circuit layer 202 having an input connected to receive a first signal under test and an output connected to a resistive load (as shown in FIG. 2B). A second conductive line 214 is on circuit layer 202, parallel the first line 206, having an input adjacent the first line output and an output connected to a resistive load adjacent the first line input (see FIG. 2B). In this aspect the optically reflective metallic pad 22 is also formed on circuit layer 202 between the first and second conductive lines 206/214. A vertical column path 224, between the first and second lines, is optically transparent from the IC first surface 204 to the reflective metal pad 222. Although circuit layer 202 is shown directly underlying surface 204, it should be understood that other circuit and interlevel dielectric (ILD) layers 205 may be interposed between circuit layer 202 and surface 204, and that the vertical column path would likewise extend through these interposing layers.

Figure 7:
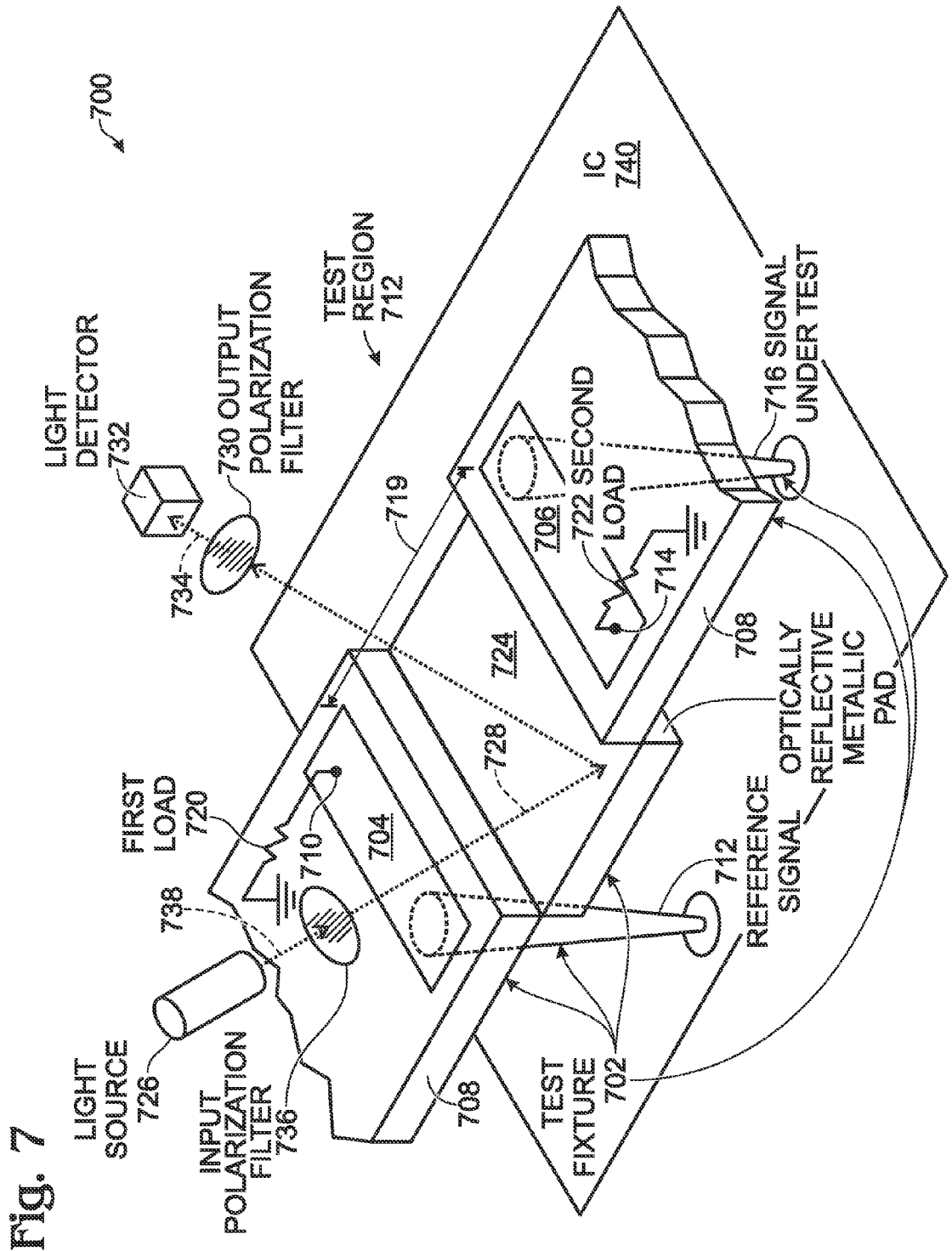
FIG. 7 is a perspective schematic diagram depicting an optical-magnetic Kerr effect signal analysis system.

FIG. 7 is a perspective schematic diagram depicting an optical-magnetic Kerr effect signal analysis system. The system 700 comprises a test fixture 702 including parallel first 704 and second 706 conductive lines formed on a dielectric 708, with a first line output 710, a first line input (probe) 712 to accept a reference signal from an integrated circuit or die 740, a second line output 714, a second line input (probe) 716 to accept a signal under test from the IC 740, and an optically transparent test region 718. The first line 704 is adjacent (and parallel to) the second line 706. A first resistive load 720 is connected to the first line output 710. A second resistive load 722 is connected to the second line output 714. An optically reflective metallic pad 724 underlies the test region 718.

Typically, the parallel conductive lines 704/706 are separated by a distance 719 in the range between one and ten wavelengths of the light source. The closer together the conductive lines 704/706, the higher the field intensity and ability to rotate the polarization angle. However, the smaller the spacing, the smaller the spot size of the light beam. High speed signals generate fewer photons of light per pulse of the electrical signal. So a trade off must be made between a larger spot size (to generate more photons), which requires wider line spacing, and field intensity. Generally, the spot size is not be less than the wavelength of light, which is 1 micron or larger in a silicon medium. A spacing of two microns is optimal for many applications.

A light source 726 overlying the parallel conductive lines 704/706 supplies light at a first angle of polarization 728 to the test region 718, towards the reflective metallic pad 724. The system includes an output polarization filter 730. A light intensity detector 732 receives reflected light 734 passing through the output polarization filter 730 to supply a maximum intensity reading in response to a reference signal not matching a signal under test.

As shown, an input polarization filter 736 has an input to accept light 738 from the light source 726 and an output to supply light at the first angle of polarization 728. Note: in some aspects, such as when the light source supplies light at a know polarization angle, the input polarization filer is not needed. The system 700 operates by adjusting the output polarization filter 730 to pass light at the first angle of polarization 728. Thus, if the test and reference signal match, the change in the angle of polarization of the reflected light is self-canceling, and no change in light intensity is detected.

In one aspect, the test fixture first line input 704 accepts a reference signal having a first frequency, and the light detector 732 has a frequency response slower than the first frequency. A measured maximum light intensity indicates that the reference signal and signal under test are different.

Figure 8A:
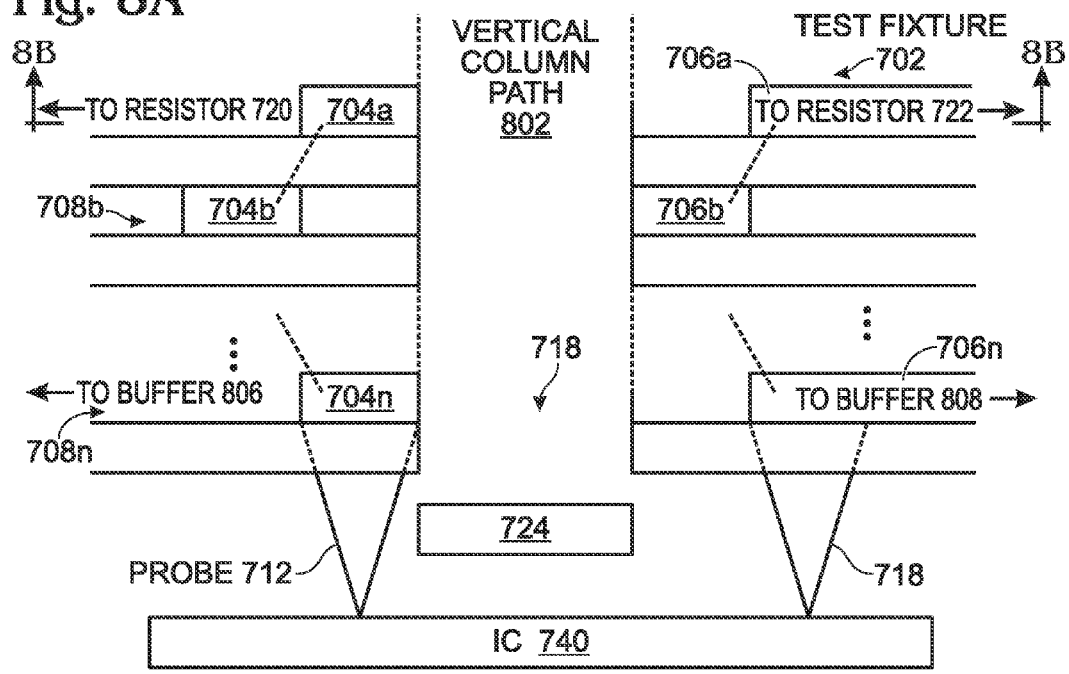
Figure 12:
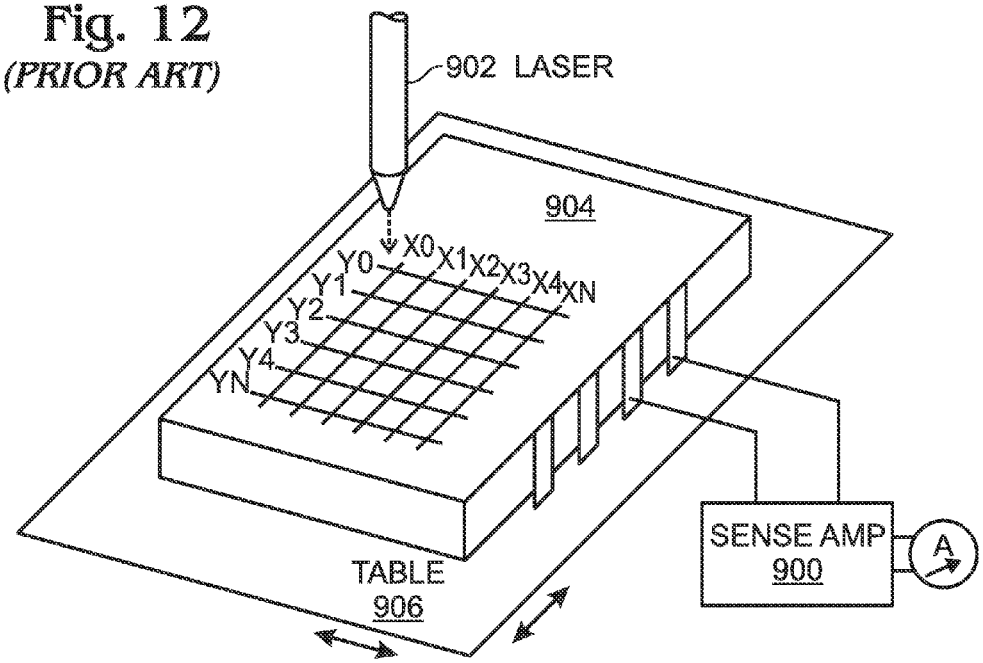
FIG. 12 depicts an exemplary system for inducing current flow by creating optical paths through an IC package (prior art).

FIGS. 8A and 8B are respective partial cross-sectional and plan views of a variation of the optical-magnetic Kerr effect signal analysis system of FIG. 7. In this aspect, the test fixture 702 includes a plurality of overlying dielectric layers 708a though 708n, where n is a variable not limited to any particular value. The parallel conductive lines 704 and 706 include parallel sections on each of the dielectric layers, connected to adjacent layers through vias represented schematically as dotted lines. Conductive line sections 704a through 704 form a helical coil, and conductive sections 706a through 706n form a helical coil that interleaves with the coil form by sections 704. The test region 718 includes a vertical column path 802 formed between conductive line sections transparent to the first wavelength of light. Lines 704a through 704n are connected to an underlying IC 740 via probe 712 to conduct a signal under test. Lines 706a through 706n are connected to the underlying IC 740 via probe 718 to conduct a reference signal. In one aspect, the signals are generated in the IC. In another aspect, as shown in FIG. 8B, the signals are supplied to the IC.

In one example (as shown), a standard ring oscillator 804 provides the signal under test and the reference signal, and buffer amplifiers 806 and 808 are interposed between the source and the conductive lines. Both buffers 806/808, both either inverting or non-inverting, are capable of driving a 50 ohm load. The metal paths from the buffers to the load resistors are in the top metal and spaced one micron apart at a specific test region having a length of ten microns. The metal lines at this test are routed such that the current is in opposite directions. The top metal lines are required to handle 24 milliamperes and are connected to 50 ohm resistors as loads to small ground pads. The ground sides of the load resistors have separate metal lines to the two small "ground pads" (25×25 microns each) that are connected to ground.

FIG. 9 is a schematic block diagram of an alternative type of optical-magnetic Kerr effect signal analysis system. The system 901 comprises a test fixture 902 including a single conductive line 904 formed on a dielectric 906 with an input to 908 accept a signal under test, having a signal frequency, from an underlying IC wafer 922. The fixture 902 has an output on line 910. A first resistive load 912 is connected to the conductive line output 910. A reflective metallic pad 914 underlies the conductive line 904.

More explicitly, input 908 is a probe extending to a die pad 920 of an IC wafer 922, which is the source of the signal under test. The current from the die pad 920, through the metal test line 904 and the load resistor 912 sets up the magnetic field around the signal test line 904. In one aspect not shown, the line can be reflected off of line 904. Alternately, the magnetic field is induced into reflective metallic pad 914, and the light is reflected off of pad 914, as shown.

A light source 916 overlies the conductive line 904, supplying light at a predetermined angle of polarization 917 towards the reflector 914. Note: an input polarization filter (not shown) may be used to supply light with the predetermined angle of polarization from a light source having an unknown polarization, or unpolarized light. The system 901 includes an output polarization filter 918. A light intensity detector 919 accepts reflected light 920 through the output polarization filter 918. The output polarization filter 918 is adjusted to supply a maximum intensity reading to a reference signal. If the same (maximum) reading is measured when a test signal is supplied, it can be assumed that the test signal matches the reference signal. Although not specifically shown, the conductive line can be formed as a coil with conductive sections in plurality of metal layers, as in FIGS. 8A and 8B. The above-disclosed fixture if especially useful for signal speeds below 28 gigahertz, which can be detected by a light detector. In that case, the data (electrical signal) output from the light detector can be compared to a reference electrical signal. For signal speeds above 28 gigahertz, the fixtures of FIGS. 7, 8A, and 8B are especially useful in that the compare function is performed at the fixture, before the light detector.

Functional Description

FIG. 10 is a flowchart illustrating a method for optical-magnetic Kerr effect signal analysis. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 supplies a test fixture including parallel conductive lines, with an input of a first line adjacent a resistively loaded output of a second line and a resistively loaded output of the first line adjacent an input of the second line. In one aspect, the first and second conductive lines are formed from coiled sections in a plurality of metal layers, see FIGS. 8A and 8B. An optically transparent test region is interposed between the conductive lines, and a metallic reflector underlies the test region. Step 1004 supplies a signal reference to the input of the first line. Step 1006 supplies a signal under test to the input of the second line. Step 1008 focuses a light beam having a first angle of polarization through the test region onto the reflector. Step 1010 measures the intensity of the reflected light. Step 1012 determines the similarity between the signal under test and the reference signal in response to the measured light intensity.

In one aspect, measuring the intensity of the reflected light includes substeps. Step 1010*a* uses an output polarizer to pass a particular polarization angle of the light. Step 1010*b* measures the light passing through the output polarizer. Further, focusing the light beam with the first angle of polarization in Step 1008 may include substeps. Step 1008*a* supplies a light source and an input polarizer. Step 1008*b* adjusts the input polarizer to supply light having the first angle of polarization.

Prior to testing, the test fixture may be calibrated. In this aspect, the signal reference is supplied in Step 1004, but not the signal under test in Step 1006. The optional supply of the signal under test is represented by the dotted line signal path between Step 1002 and 1006. Then, using the output polarizer to pass the particular polarization of light includes calibrating the output polarizer to pass the first angle of polarization by adjusting the output polarizer to pass the maximum light intensity.

In one aspect, supplying the signal reference to the input of the first line in Step 1004 includes supplying an ac signal reference having a first frequency. Measuring the intensity of light in Step 1010 includes using a light detector having a frequency response slower than the first frequency and measuring a maximum light intensity. Then, determining the similarity between the signal under test and the reference signal in Step 1012 includes determining that the signals are different in response to measuring the maximum intensity. Alternately, Step 1004 supplies an ac signal reference having a first frequency and a plurality of information patterns. Then, Step 1010 uses a light detector having a frequency response greater than the first frequency and measures a maximum light intensity in a first period of time associated with a first information pattern. Step 1012 determines that the signals are different during the first period of time, in response to measuring the maximum intensity.

FIG. 11 is a flowchart illustrating a variation in the method for optical-magnetic Kerr effect signal analysis. The method starts at Step 1100. Step 1102 supplies a test fixture including a single conductive line, with an input and a resistively loaded output, and a reflective metallic pad underlying the conductive line. In one aspect, the conductive line is formed as a coil of sections in a plurality of metal layers. Step 1104 supplies an ac signal under test, having a frequency, to the input of the conductive line. Step 1106 focuses a light beam having a predetermined angle of polarization through a region adjacent the conductive line on the reflective metallic pad. Step 1108 polarizes the reflected light. Step 1110 adjusts the angle of polarization of the reflected light to obtain a maximum intensity. Step 1112 determines the fidelity of the signal under test in response to the adjusted angle of polarization.

In one aspect, determining the fidelity of the signal under test includes substeps. Step 1112*a* uses a light detector having a frequency response slower that the first frequency, and measures a maximum light intensity. Step 1112*b* determines that the signal under test lacks fidelity in response to measuring the maximum intensity.

In another aspect, Step 1004 supplies ac signal having a plurality of information patterns. Then, determining the fidelity of the signal under test includes alternate substeps. Step 1112*c* uses a light detector having a frequency response greater than the first frequency, and measures a maximum light intensity in a first time period associated with a first information pattern. Step 1112*d* determines that the first information portion of signal under test lacks fidelity in response to measuring the maximum intensity.

System and methods have been provided for using the Kerr effect to test electrical signals. Examples of particular test fixtures and measurement techniques have been given to illustrate the invention. However, the invention is not limited to merely these examples. Other variations and embodiments of the invention will occur to those skilled in the art.

I claim:

1. A method for optical-magnetic Kerr effect signal analysis, the method comprising:

supplying a test fixture including parallel conductive lines, with an input of a first line adjacent a resistively loaded output of a second line and a resistively loaded output of the first line adjacent an input of the second line, an optically transparent test region interposed between the conductive lines, and a metallic reflector underlying the test region;

supplying a signal reference to the input of the first line;

supplying a signal under test to the input of the second line;

focusing a light beam having a first angle of polarization through the test region onto the reflector;

measuring the intensity of the reflected light; and, determining a similarity between the signal under test and the reference signal in response to the measured light intensity.

2. The method of claim 1 wherein measuring the intensity of the reflected light includes:

using an output polarizer to pass a particular polarization angle of the light; and, measuring the light passing through the output polarizer.

3. The method of claim 2 wherein focusing the light beam with the first angle of polarization includes:

supplying a light source and an input polarizer; and, adjusting the input polarizer to supply light having the first angle of polarization.

4. The method of claim 2 further comprising:
supplying the signal reference, but not the signal under test;
wherein using the output polarizer to pass the particular polarization of light includes calibrating the output polarizer to pass the first angle of polarization by adjusting the output polarizer to pass the maximum light intensity.

5. The method of claim 1 wherein supplying the signal reference to the input of the first line includes supplying an ac signal reference having a first frequency;
wherein measuring the intensity of light includes using a light detector having a frequency response slower that the first frequency and measuring a maximum light intensity; and,
wherein determining the similarity between the signal under test and the reference signal includes determining that the signals are different in response to measuring the maximum intensity.

6. The method of claim 1 wherein supplying the signal reference to the input of the first line includes supplying an ac signal reference having a first frequency and a plurality of information patterns; and,
wherein measuring the intensity of light includes using a light detector having a frequency response greater than the first frequency and measuring a maximum light intensity in a first period of time associated with a first information pattern; and,
wherein determining the similarity between the signal under test and the reference signal includes determining that the signals are different during the first period of time, in response to measuring the maximum intensity.

* * * * *